(12) United States Patent
Lee et al.

(10) Patent No.: US 8,004,181 B2
(45) Date of Patent: Aug. 23, 2011

(54) ORGANIC LIGHT EMITTING DIODE DISPLAY

(75) Inventors: Sung-Hun Lee, Seoul (KR); Sung-Soo Lee, Suwon-Si (KR); Seong-Min Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 168 days.

(21) Appl. No.: 12/420,755

(22) Filed: Apr. 8, 2009

(65) Prior Publication Data

US 2010/0127614 A1   May 27, 2010

(30) Foreign Application Priority Data

Nov. 26, 2008   (KR) ........................ 10-2008-0118223

(51) Int. Cl.
*H01J 1/62* (2006.01)
(52) U.S. Cl. ........................ 313/504; 313/506
(58) Field of Classification Search .................. 313/498, 313/504, 506
See application file for complete search history.

(56) References Cited

U.S. PATENT DOCUMENTS

| | | |
|---|---|---|
| 6,861,800 B2 | 3/2005 | Tyan et al. |
| 2006/0066228 A1 | 3/2006 | Antoniadis et al. |
| 2006/0267485 A1 | 11/2006 | Wood et al. |

FOREIGN PATENT DOCUMENTS

| | | |
|---|---|---|
| JP | 2006-236947 | 9/2006 |
| JP | 2007-026867 | 2/2007 |
| KR | 10-2006-0095494 | 8/2006 |
| KR | 10-2007-0031879 | 3/2007 |
| KR | 10-2007-0085709 | 8/2007 |

*Primary Examiner* — Vip Patel
(74) *Attorney, Agent, or Firm* — Innovation Counsel LLP

(57) ABSTRACT

An organic light emitting device according to an embodiment comprises: a substrate; a transflective member disposed on the substrate; a phase control member disposed on or under the transflective member; an organic light emitting member disposed on the phase control member; and a common electrode disposed on the organic light emitting member. A changing characteristic according to wavelength of an optical constant of the phase control member is opposite to a changing characteristic according to wavelength of an optical constant of the transflective member.

31 Claims, 13 Drawing Sheets

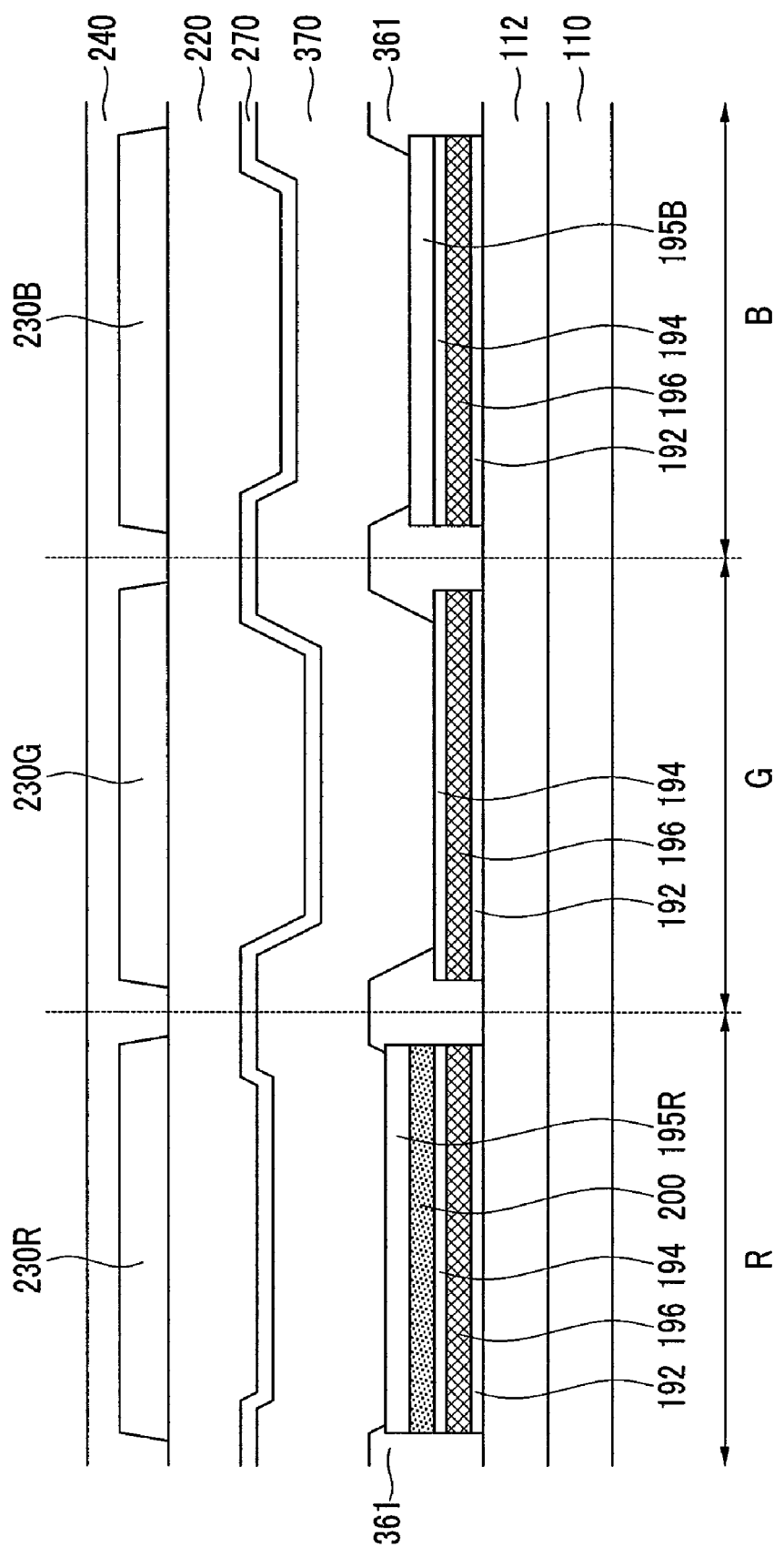

ORGANIC LIGHT EMITTING DIODE DISPLAY

CROSS-REFERENCE TO RELATED APPLICATIONS

This application claims priority to and the benefit of Korean Patent Application No. 10-2008-0118223 filed in the Korean Intellectual Property Office on Nov. 26, 2008, the entire contents of which are incorporated herein by reference.

BACKGROUND

1. Technical Field

The present invention relates to an organic light emitting device.

2. Related Art

An organic light emitting device includes two electrodes and an organic light emitting layer interposed between the two electrodes. One of the two electrodes injects holes and the other injects electrons into the light emitting layer. The injected electrons and holes combine to generate excitons. The excitons emit light while discharging energy.

Because an organic light emitting device is a self-emissive display device, an additional light source is not necessary. Accordingly, the organic light emitting device has lower power consumption as well as a high response speed, wide viewing angle, and high contrast ratio. In addition, the organic light emitting device includes a plurality of pixels such as red pixels, blue pixels, green pixels and white pixels, and displays images of full colors by selectively combining these pixels. Each of the pixels includes an organic light emitting element and a plurality of thin film transistors for driving it.

An organic light emitting element includes an anode and a cathode as two electrodes and an organic light emitting member as an emission layer. The organic light emitting member emits light of one of the three primary colors such as red, green, and blue, or white color. Materials for the organic light emitting member vary according to the colors that the organic light emitting member emits. For emission of white light, a method of stacking light emitting materials that emit red, green, and blue so that the synthesized light becomes white is mainly used. Moreover, in a case where the organic light emitting member emits a white light, color filters are used to obtain light of a desired color.

The above information disclosed in this Background section is only for enhancement of understanding of the background of the invention and therefore it may contain information that does not form the prior art that is already known in this country to a person of ordinary skill in the art.

SUMMARY

An organic light emitting device according to an embodiment of the present invention comprises: a substrate; a transflective member disposed on the substrate; a phase control member disposed on or under the transflective member; an organic light emitting member disposed on the phase control member; and a common electrode disposed on the organic light emitting member, wherein a changing characteristic according to wavelength of an optical constant of the phase control member varies in opposition to a changing characteristic according to wavelength of an optical constant of the transflective member.

The wavelength may comprise a wavelength of a visible light region. The optical constant of the phase control member may decrease according to the wavelength of the visible light region while the optical constant of the transflective member increases according to the wavelength of the visible light region. The optical constant of the phase control member may increase according to the wavelength of the visible light region while the optical constant of the transflective member decreases according to the wavelength of the visible light region. The optical constant of the phase control member may comprise an extinction coefficient of the phase control member, and the optical constant of the transflective member may comprise an extinction coefficient of the transflective member. The phase control member may comprise at least one of a semiconductor, a dielectric material in which a semiconductor is dispersed, a transparent conductive oxide in which a semiconductor is dispersed, a dielectric material in which a nanocrystalline metal is dispersed, and a transparent conductive oxide in which a nanocrystalline metal is dispersed. The semiconductor may comprise silicon (Si), germanium (Ge), or gallium arsenide (GaAs), and the transparent conductive oxide may comprise indium tin oxide (ITO) or indium zinc oxide (IZO). A thickness of the phase control member may be equal to or less than 500 Å. The transflective member may comprise at least one of Ag and Al.

The organic light emitting may further comprise a conductive oxide member disposed on or under the transflective member. The conductive oxide member may comprise ITO or IZO. The organic light emitting member may emit light of white color. The organic light emitting device may further comprise a color filter disposed between the substrate and the transflective member.

An organic light emitting device according to another embodiment of the present invention comprises: a first pixel displaying a first color, a second pixel displaying a second color, and a third pixel displaying a third color, wherein each of the first, second, and third pixels may comprise a transflective member; an organic light emitting member disposed on the transflective member; and a common electrode formed on the organic light emitting member, wherein at least one of the first, second, and third pixels further comprises a phase control member disposed on or under the transflective member, and a changing characteristic according to wavelength of an optical constant of the phase control member varies oppositely to a changing characteristic according to wavelength of an optical constant of the transflective member.

The wavelength may comprise a wavelength of a visible light region. The optical constant of the phase control member may decrease according to the wavelength of the visible light region while the optical constant of the transflective member increases according to the wavelength of the visible light region. The optical constant of the phase control member may increase according to the wavelength of the visible light region while the optical constant of the transflective member decreases according to the wavelength of the visible light region. The optical constant of the phase control member may comprise an extinction coefficient of the phase control member, and the optical constant of the transflective member may comprise an extinction coefficient of the transflective member. The phase control member may comprise at least one of a semiconductor, a dielectric material in which a semiconductor is dispersed, a transparent conductive oxide in which a semiconductor is dispersed, a dielectric material in which a nanocrystalline metal is dispersed, and a transparent conductive oxide in which a nanocrystalline metal is dispersed. The thickness of the phase control member may be equal to or less than 500 Å. The transflective member may comprise at least one of Ag and Al. The first, second, and third pixels may further comprise a conductive oxide member disposed on or under the transflective member. The organic light emitting member may comprise a white organic light emitting member, and the first pixel may comprise a first color filter, the second pixel may comprise a second color filter, and the third pixel may comprise a third color filter, each of the first, second and third color filters being disposed under the transflective member. The first color may comprise red, the second color may comprise green, and the third color may comprise blue. At least one pixel of the first, second, and third pixels may further comprise a supplementary member disposed between the transflective member and the common electrode. The supplementary member may comprise a transparent conductive material comprising ITO or IZO.

An organic light emitting device according to another embodiment of the present invention comprises a first pixel displaying a first color, a second pixel displaying a second color, and a third pixel displaying a third color, wherein each of the first, second, and third pixels may comprise a reflective member, an organic light emitting member disposed on the reflective member, and a transflective common electrode disposed on the organic light emitting member, and wherein at least one pixel of the first, second, and third pixels further comprises a phase control member disposed on or under the reflective member, and a changing characteristic according to wavelength of an optical constant of the phase control member varies in opposition to the changing characteristic according to wavelength of an optical constant of the reflective member. The first pixel may comprise a first color filter, the second pixel may comprise a second color filter, and the third pixel may comprise a third color filter, each of the first, second and third color filters being disposed under the transflective common electrode. The optical constant of the phase control member may decrease according to the wavelength of the visible light region while the optical constant of the reflective member increases according to the wavelength of the visible light region. The optical constant of the phase control member may increase according to the wavelength of the visible light region while the optical constant of the reflective member decreases according to the wavelength of the visible light region. The optical constant of the phase control member may comprise an extinction coefficient of the phase control member, and the optical constant of the reflective member may comprise an extinction coefficient of the reflective member.

BRIEF DESCRIPTION OF THE DRAWINGS

FIG. 7 is a cross-sectional view of three pixels in an organic light emitting device according to an embodiment of the present invention.

DETAILED DESCRIPTION

Figure 1:
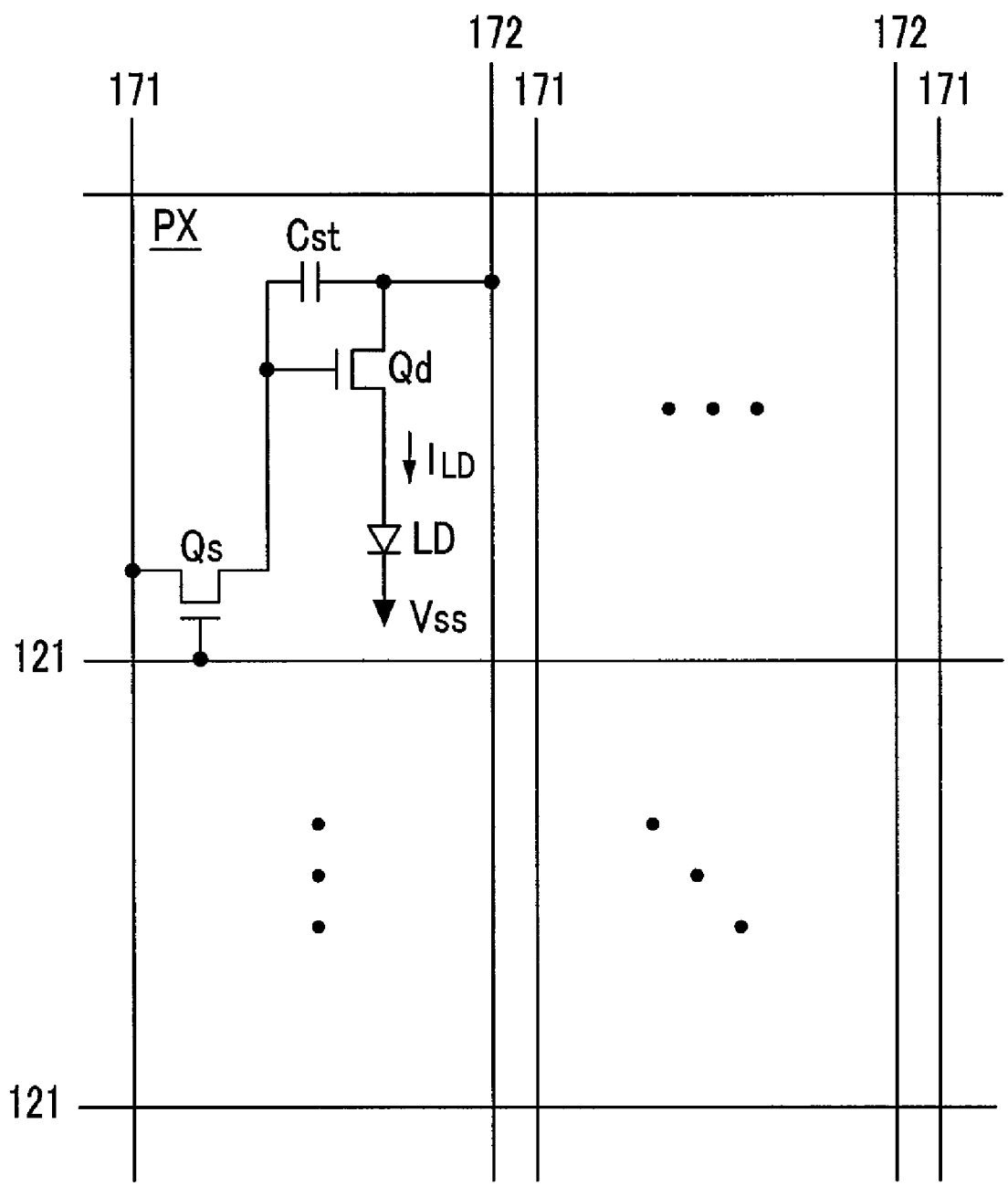
FIG. 1 is an equivalent circuit schematic diagram of an organic light emitting diode (OLED) display according to an embodiment of the present invention.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

In the drawings, the thickness, for example, of layers, films, panels, and regions, may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

An organic light emitting device according to an embodiment of the present invention will now be described with reference to FIG. 1. FIG. 1 is an equivalent circuit diagram of an organic light emitting device according to an embodiment of the present invention. Referring to FIG. 1, an organic light emitting device according to an embodiment includes a plurality of signal lines 121, 171, and 172, and a plurality of pixels PX connected thereto and arranged substantially in a matrix.

The signal lines include a plurality of scanning signal lines 121 for transmitting gate signals (or scanning signals), a plurality of data lines 171 for transmitting data signals, and a plurality of driving voltage lines 172 for transmitting a driving voltage. The scanning signal lines 121 extend substantially in a row direction and are substantially parallel to each other, and the data lines 171 extend substantially in a column direction and are substantially parallel to each other. The driving voltage lines 172 extend substantially in a column direction and are substantially parallel to each other. However, they may extend in the row direction or may be formed in a mesh shape.

Each pixel PX may include a switching transistor Qs, a driving transistor Qd, a storage capacitor Cst, and an organic light emitting element LD.

The switching transistor Qs has a control terminal connected to one of the scanning signal lines 121, an input terminal connected to one of the data lines 171, and an output terminal connected to the driving transistor Qd. The switching transistor Qs transmits the data signals applied to the data line 171 to the driving transistor Qd in response to a gate signal applied to the scanning signal line 121.

The driving transistor Qd has a control terminal connected to the switching transistor Qs, an input terminal connected to the driving voltage line 172, and an output terminal connected to the organic light emitting element LD. The driving transistor Qd drives an output current ILD having a magnitude depending on the voltage between the control terminal and the output terminal of driving transistor Qd.

The storage capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element LD as an organic light emitting diode (OLED) has an anode connected to the output terminal of the driving transistor Qd and a cathode connected to a common voltage Vss. The organic light emitting element LD emits light having an intensity depending on an output current ILD of the driving transistor Qd, thereby displaying images. The organic light emitting element LD may include an organic material uniquely emitting at least one of the primary colors such as the three primary colors of red, green, and blue, or a white color, and may emit desired images by a spatial sum thereof.

The switching transistor Qs and the driving transistor Qd may be N-channel field effect transistors (FETs). However at least one of them may be a P-channel FET. In addition, the connection relations among the transistors Qs and Qd, the capacitor Cst, and the organic light emitting diode LD may be modified in various ways.

A structure of an organic light emitting device according to one or more embodiments of the present invention will now be described with reference to FIG. 2 through FIG. 6B as well as FIG. 1. FIG. 2, FIG. 3, FIG. 4, and FIG. 5 (and also FIG. 7) are cross-sectional views of three pixels in an organic light emitting device according to one or more embodiments of the present invention, and FIG. 6A is a graph showing changing characteristics according to wavelength of an extinction coefficient of a transflective metal member made of silver, and FIG. 6B is a graph showing changing characteristics according to wavelength of an extinction coefficient of a phase control member made of silicon. Referring to FIG. 2 through FIG. 5, an organic light emitting device according to one or more embodiments of the present invention may include three pixels R, G, and B displaying three primary colors. Hereafter, the description is given with red, green, and blue as an example of the three primary colors. A pixel displaying red is referred to as a red pixel R, a pixel displaying green is referred to as a green pixel G, a pixel displaying blue is referred to as a blue pixel B, and these three pixels R, G and B are alternately disposed and form one group. The structures of the three pixels R, G, and B may be almost the same. Thus, the same constituent elements are indicated by the same reference numerals.

Referring to FIG. 2 through FIG. 5, a thin film transistor array is disposed on an insulation substrate 110 that may be made of transparent glass or plastic. The thin film transistor array includes a switching transistor (not shown) and a driving transistor (not shown) formed in each pixel R, G, and B.

An insulating layer 112 that may be made of an inorganic material or an organic material is formed on the thin film transistor array. A red color filter 230R of the red pixel R, a green color filter 230G of the green pixel G, and a blue color filter 230B of the blue pixel B are formed on the insulating layer 112. An overcoat 180 is formed on the color filters 230R, 230G, and 230B, and the insulating layer 112. The overcoat 180 may be made of an organic material, and may have a flat surface. The insulating layer 112 and the overcoat 180 may have a contact hole (not shown) exposing a portion of the driving transistor (not shown) of the thin film transistor array. A lower conductive oxide member 192, a transflective metal member 193, and an upper conductive oxide member 194 are respectively formed in each pixel R, G, and B on the overcoat 180.

The lower conductive oxide member 192 and the upper conductive oxide member 194 may improve adhesion between the transflective metal member 193 and another layer, and prevent corrosion thereof. Particularly, the lower conductive oxide member 192 may protect the transflective metal member 193 from oxygen or moisture that may flow from the overcoat 180. The lower and upper conductive oxide members 192 and 194 may be made of a transparent conductive oxide such as indium tin oxide (ITO) or indium zinc oxide (IZO).

The transflective metal member 193 may be disposed between the lower conductive oxide member 192 and the upper conductive oxide member 194. The transflective metal member 193 may be made of a metal having high reflectance such as Ag or Al, or alloys thereof, and the thickness of transflective metal member 193 may be in the range of about 50 Å-250 Å. If a metal is thin enough, the metal film may have transflective characteristics so that incident light may be both reflected and transmitted.

In addition, a phase control member 200 may be formed on or under the transflective metal member 193 on a portion of or all of the pixels R, G, and B. FIG. 2 through FIG. 5 show the various positions of the phase control member 200 according to various embodiments of the present invention.

Figure 2:
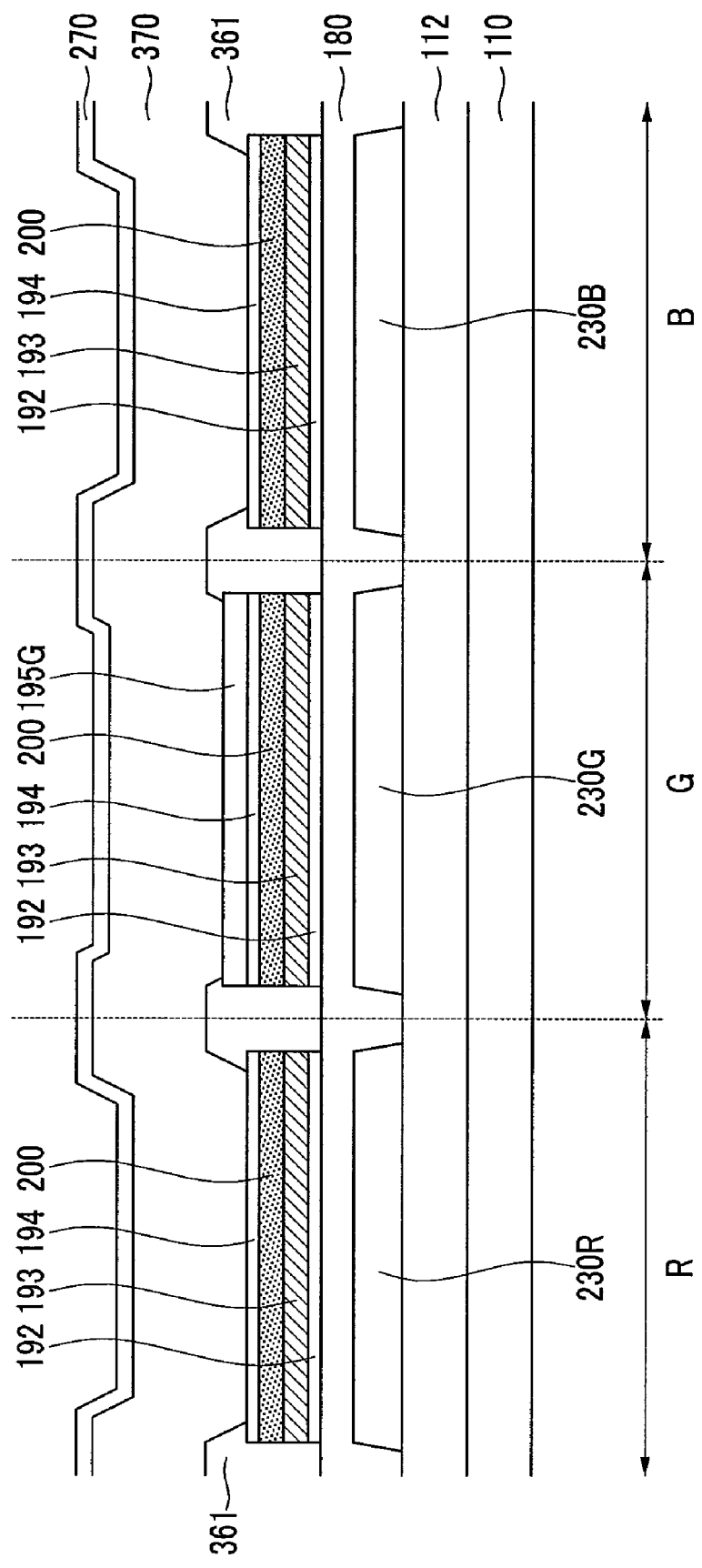
FIG. 2, FIG. 3, FIG. 4, and FIG. 5 are cross-sectional views of three pixels in an organic light emitting device according to one or more embodiments of the present invention.

In the embodiment of FIG. 2, the phase control member 200 is formed in all pixels R, G, and B. However, in FIG. 3, the phase control member 200 is only formed in the red and blue pixels R and B. Also, in the embodiment of FIG. 4, the phase control member 200 is only formed in the red pixel R, and in FIG. 5, the phase control member 200 is only formed in the blue pixel B. The phase control member 200 may be disposed in any of various alternative combinations of the pixels R, G, and B.

Figure 3:
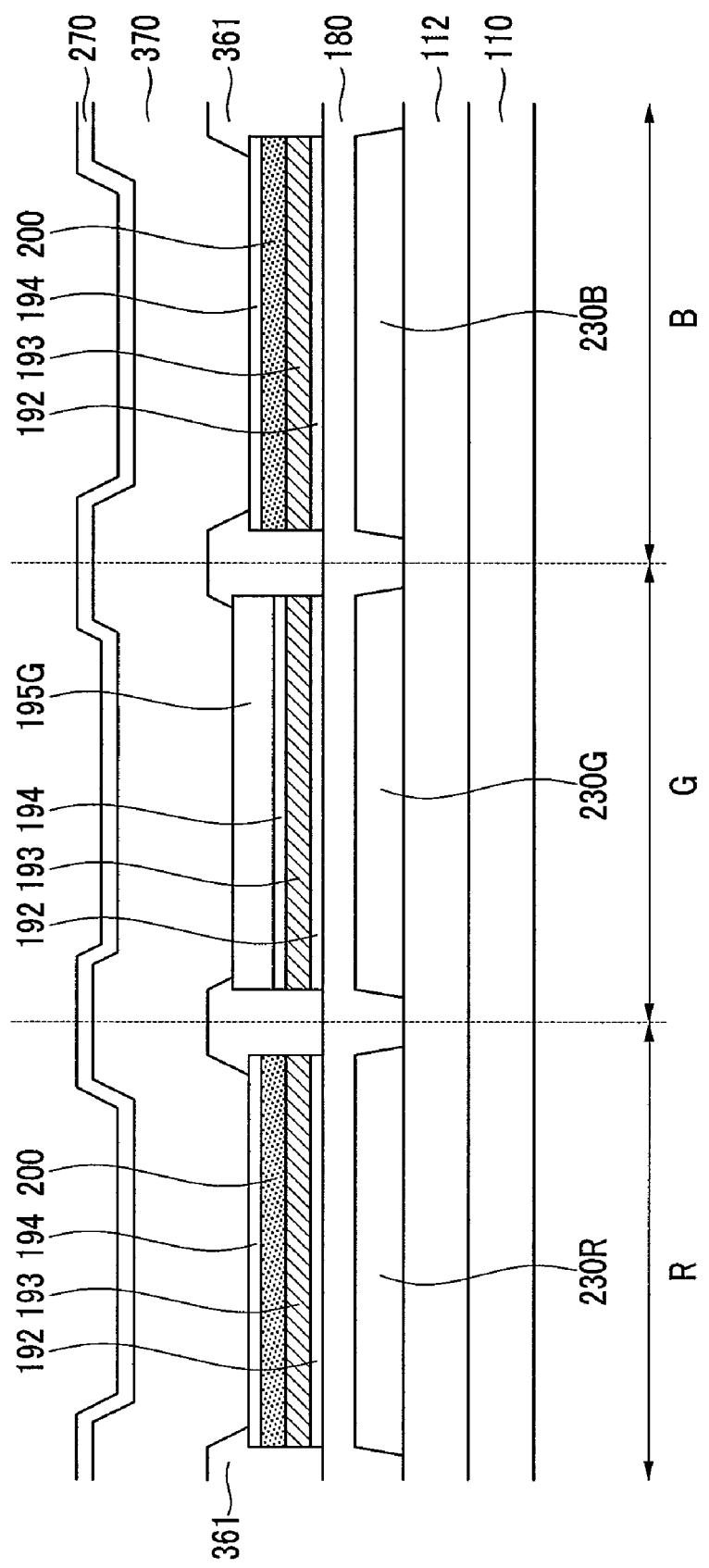
Figure 4:
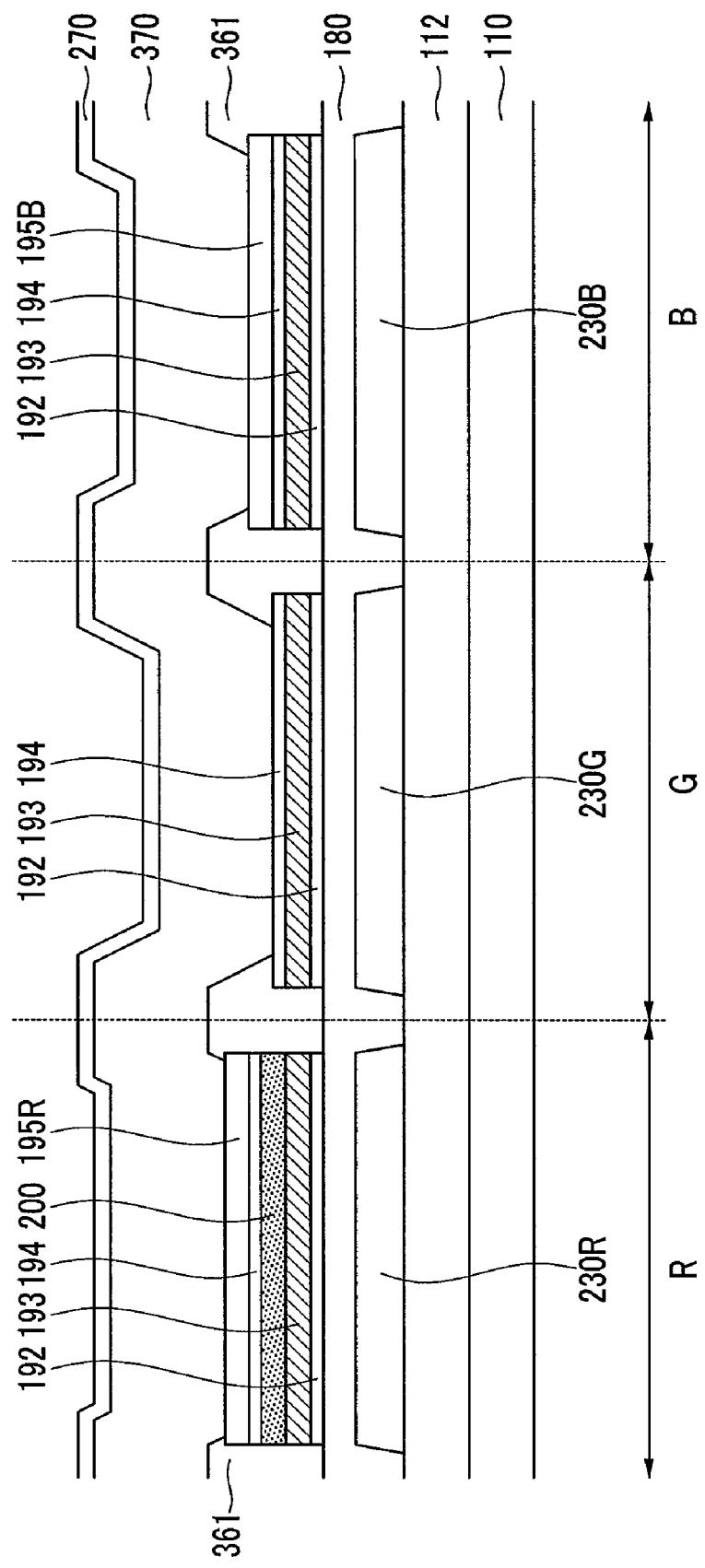
Figure 5:
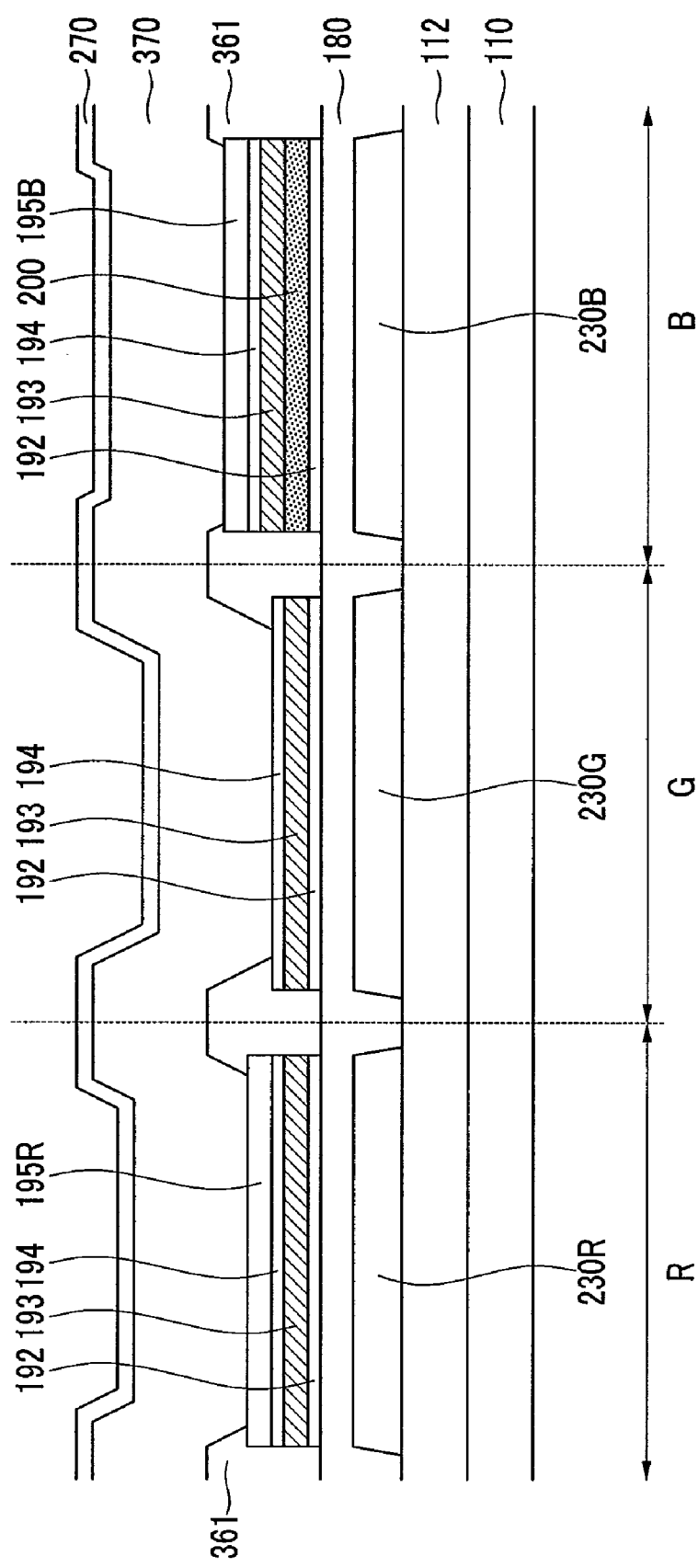
Figure 6A:
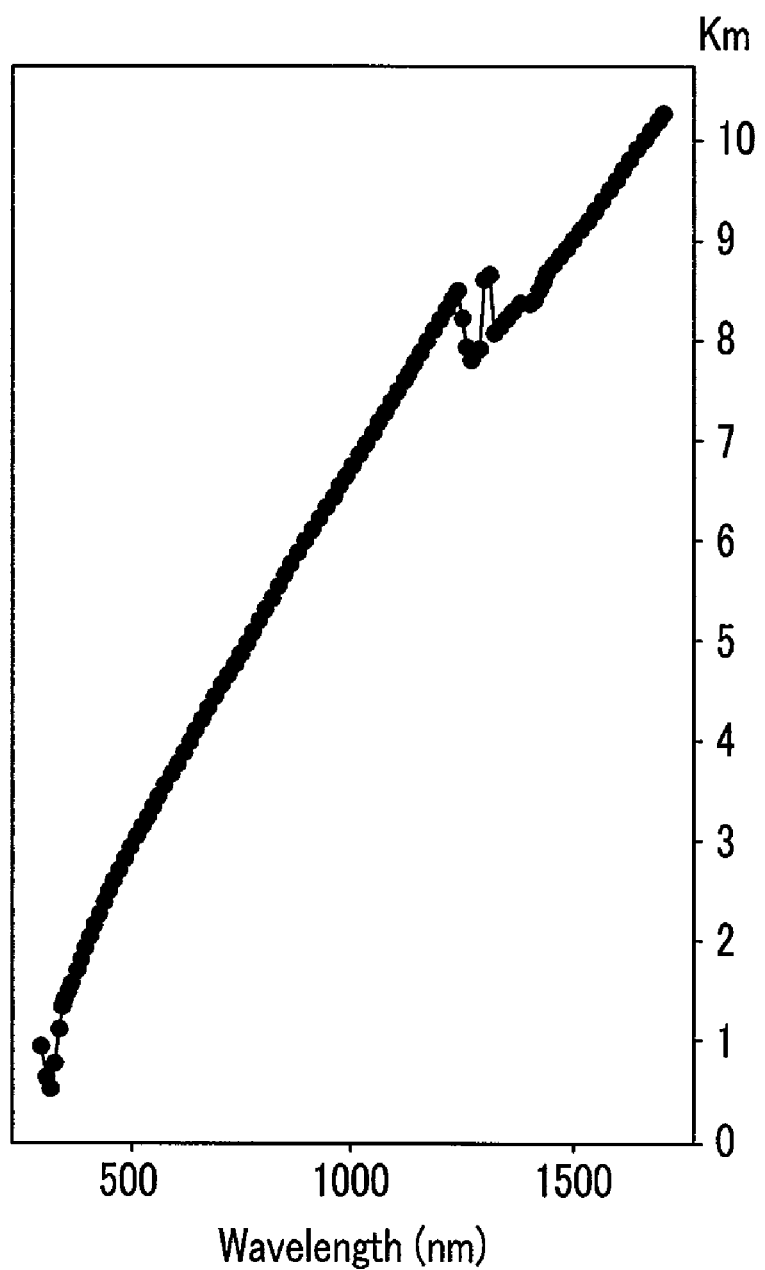
FIG. 6A is a graph showing changing characteristics of an extinction coefficient of a transflective metal member made of silver according to wavelength.
Figure 6B:
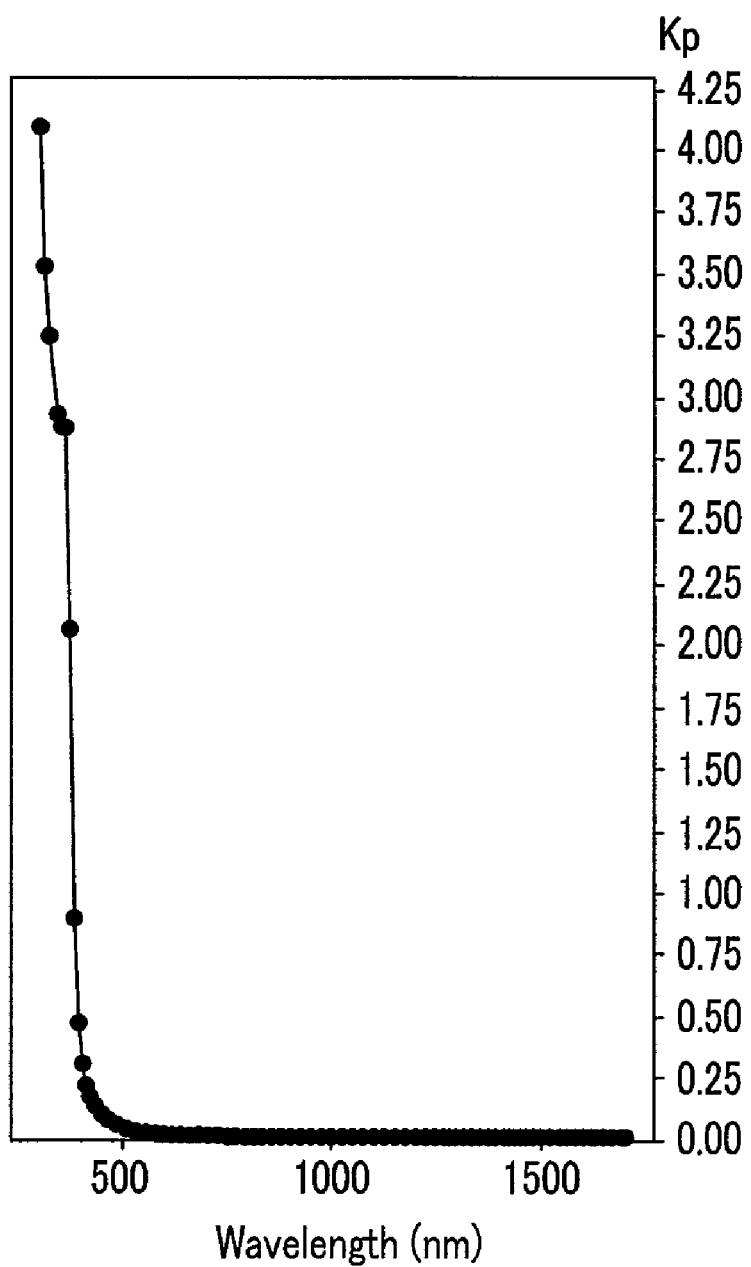
FIG. 6B is a graph showing changing characteristics of an extinction coefficient of a phase control member made of silicon according to wavelength.

As shown in FIG. 2, FIG. 3, and FIG. 4, the phase control member 200 may be disposed between the transflective metal member 193 and the upper conductive oxide member 194, or as shown in FIG. 5, the phase control member 200 may be disposed between the transflective metal member 193 and the lower conductive oxide member 192. The phase control member 200 may be disposed in any of various alternative positions on or under the transflective metal member 193.

The phase control member 200 may have an optical factor, such as an extinction coefficient (Kp), that changes as a function of wavelength in a direction that is opposite to (e.g., varies oppositely from or in opposition to) that of an optical factor, such as an extinction coefficient (Km), of the transflective metal member 193. Particularly, a changing value of the extinction coefficient Kp of the phase control member 200 according to the wavelength of the visible light region may be opposite to a changing value of the extinction coefficient Km of the transflective metal member 193 according to the wavelength of the visible light region. When an extinction coefficient Km of the transflective metal member 193 increases as the wavelength of the visible light region increases (for example, when the transflective metal member 193 is silver), the extinction coefficient Kp of the phase control member 200 may decrease as the wavelength of the visible light region increases (for example, when the phase control member 200 is silicon). An example of changing values of the extinction coefficients Km and Kp according to wavelength when the transflective metal member 193 is made of silver and the phase control member 200 is made of silicon is shown in FIG. 6A and FIG. 6B, respectively. Conversely, when the extinction coefficient Km of the transflective metal member 193 decreases as the wavelength of the visible light region increases, the extinction coefficient Kp of the phase control member 200 may increase as the wavelength of the visible light region increases. When an extinction coefficient Kmr for red wavelength of the transflective metal member 193 is larger than an extinction coefficient Kmb for blue wavelength of the transflective metal member 193, an extinction coefficient Kpr for the red wavelength of the phase control member 200 may be smaller than an extinction coefficient Kpb for the blue wavelength, or viceversa.

The phase control member 200 may be made of a semiconductor such as silicon (Si), germanium (Ge), or gallium arsenide (GaAs), a dielectric material in which a semiconductor is dispersed, a transparent conductive oxide such as ITO or IZO in which a semiconductor is dispersed, a dielectric material in which a nanocrystalline metal is dispersed, or a transparent conductive oxide such as ITO or IZO in which a nanocrystalline metal is dispersed. The phase control member 200 may be formed using chemical vapor deposition (CVD), sputtering, vacuum plating, or spin coating. A thickness of the phase control member 200 may be equal to or less than 500 Å. The thickness is not limited to 500 Å, however, and may be changed according to the extinction coefficient Kp of the phase control member 200. For example, if the extinction coefficient Kp of the phase control member 200 increases, the thickness of the phase control member 200 may be reduced, and vice versa.

According to the embodiments illustrated by FIG. 2 and FIG. 3, a supplementary member 195G may be formed on the upper conductive oxide member 194 of the green pixel G. Similarly, according to the embodiments shown in FIG. 4 and FIG. 5, supplementary members 195R and 195B may be respectively formed on the upper conductive oxide member 194 of the red and blue pixels R and B. In FIG. 4 and FIG. 5, the supplementary members 195R and 195B of the red and blue pixels R and B may have the same thickness. In FIG. 2 and FIG. 3, however, the supplementary member 195G of the green pixel G may have a different thickness from that of the supplementary members 195R and 195B. The supplementary members 195G, 195R, and 195B may be made of a transparent conductive material such as ITO or IZO, and in this case, the upper conductive oxide member 194 that may be made with the same material as the supplementary members 195G, 195R, and 195B may be omitted. Alternatively, the supplementary members 195G, 195R, and 195B may be disposed in various layers on the transflective metal member 193.

A plurality of insulating members 361 for insulation are formed between the upper conductive oxide members 194 or the supplementary members 195G, 195R, and 195B. The insulating members 361 may be omitted.

An organic light emitting member 370 is formed on the whole surface of the upper conductive oxide members 194, the supplementary members 195G, 195R, and 195B, and the insulating members 361. The organic light emitting member 370 may have a structure in which a plurality of organic material layers emitting different colors are stacked, thereby emitting white color.

A common electrode 270 transmitting a common voltage Vss is formed on the organic light emitting member 370. The common electrode 270 may be made of a reflective metal including, for example, calcium (Ca), barium (Ba), magnesium (Mg), aluminum (Al), and silver (Ag).

An encapsulation layer (not shown) may be further formed on the common electrode 270. The encapsulation layer encapsulates the organic light emitting member 370 and the common electrode 270 such that moisture and/or oxygen may be prevented from flowing in from the external surroundings.

The upper conductive oxide member 194 or the supplementary members 195G, 195R, and 195B may receive a voltage from a driving transistor (not shown) of the thin film transistor array through a contact hole (not shown). When the phase control member 200 is made of a conductive material, the upper conductive oxide member 194 or the supplementary members 195G, 195R, and 195B may directly receive the voltage from the phase control member 200. In such an organic light emitting device, the upper conductive oxide member 194 or the supplementary members 195G, 195R, and 195B, the organic light emitting member 370, and the common electrode 270 form an organic light emitting diode LD.

The organic light emitting device emits light in the lower direction with respect to the substrate 110 to display images. Light emitted toward the substrate 110 from the organic light emitting member 370 passes through thin films including the supplementary member 195G (only corresponding to the green pixel G in FIG. 2 and FIG. 3, and corresponding to red and blue pixels R and B in FIG. 4 and FIG. 5) and the upper conductive oxide member 194, and arrives at the transflective metal member 193. The incident light is reflected toward the common electrode 270 near the transflective metal member 193, and the common electrode 270 reflects it again toward the transflective metal member 193. Accordingly, light reciprocating between the transflective metal member 193 and the common electrode 270 is subject to an optical process such as interference, and passes through the transflective metal member 193 and the color filters 230R, 230G, and 230B to the outside if appropriate conditions are satisfied. This reciprocating and interference process is referred to as a microcavity process.

The optical path length of the microcavity may be changed according to the thickness and the refractive indices of the thin films disposed between the transflective metal member 193 and the common electrode 270. Therefore, the thicknesses and the materials of the thin films may be appropriately selected so that light having the wavelengths corresponding to the primary colors may be enhanced. For example, in the embodiment shown in FIG. 2 and FIG. 3, the thicknesses and refractive indices of the phase control member 200, the upper conductive oxide member 194, and the organic light emitting member 370 of the red and blue pixels R and B may be selected so that the intensity of light corresponding to the red and blue wavelengths may be enhanced through the microcavity process. Also, the thickness and refractive index of the supplementary member 195G in the green pixel G may be selected so that the intensity of light corresponding to the green wavelength may be enhanced. Alternatively, as shown in the embodiment of FIG. 4 and FIG. 5, the thicknesses and the refractive indices of the upper conductive oxide member 194 and the organic light emitting member 370 in the green pixel G may be selected so that the intensity of light of the green wavelength may be enhanced. Also, the thicknesses and refractive indices of the supplementary members 195R and 195B or the phase control member 200 of the red and blue pixels R and B may be selected so that the intensity of light of the red and blue wavelengths may be enhanced. In this way, light having the desired optical characteristics, such as light having a desired spectrum of wavelength and color purity for each primary color of red, green, and blue, may be obtained; photoefficiency of an organic light emitting device may be improved; and color reproducibility may be improved.

An organic light emitting device according to another embodiment of the present invention will now be described with reference to FIG. 7. FIG. 7 is a cross-sectional view of three pixels of an organic light emitting device according to an embodiment of the present invention. An organic light emitting device according to the embodiment shown in FIG. 7 may have substantially the same cross-sectional structure as the organic light emitting device shown in FIG. 2 through FIG. 5. Thus, the same descriptions as those of the above described embodiments are omitted, and the same constituent elements are indicated by the same reference numerals.

A thin film transistor array, an insulating layer 112, a lower conductive oxide member 192, a reflective member 196, an upper conductive oxide member 194, a phase control member 200 (only corresponding to the red pixel R), supplementary members 195R and 195B (only corresponding to the red and blue pixels R and B), an insulating member 361, a white organic light emitting member 370, a common electrode 270, a lower overcoat 220, color filters 230R, 230G, and 230B, and an upper overcoat 240 are sequentially formed on the insulation substrate 110 of each of pixels R, G, and B.

Unlike the previous embodiment, the present embodiment illustrates an organic light emitting device that includes a reflective member 196 rather than the transflective metal member 193. The reflective member 196 may be made of a metal such as aluminum or an aluminum alloy, silver or a silver alloy, or an opaque conductive material having a high work function such as Au, Pt, Ni, Cu, W, or alloys thereof.

The lower and upper conductive oxide members 192 and 194 are also disposed on or under the reflective member 196, and may increase the cohesion between the reflective member and another layer. The lower and upper conductive oxide members 192 and 194 may be made of a transparent conductive oxide such as ITO or IZO. The phase control member 200 is disposed on the upper conductive oxide member 194. The common electrode 270 may be made of a metal such as Ca, Ba, Mg, Al, and Ag, and may have a transflective characteristic. The color filters 230R, 230G, and 230B are disposed on the common electrode 270 unlike the previous embodiment, and the lower and upper overcoats 220 and 240 may be made of the insulating material.

The organic light emitting device emits light in the upper direction with respect to the substrate 110 to display images. Light emitted from the organic light emitting member 370 reciprocates between the reflective member 196 and the common electrode 270 and is subject to an optical process such as interference, and passes through the color filters 230R, 230G, and 230B to the outside if appropriate conditions are satisfied. Various characteristics of the previous embodiments may pertain to the organic light emitting device of FIG. 7.

In addition, when the extinction coefficient Km of the transflective metal member 193 of FIG. 2 through FIG. 5, or the reflective member 196 of FIG. 7, is changed according to wavelength, light reflected at the transflective metal member 193 or the reflective member 196 has a different degree of a phase shift according to the wavelength. Such a difference in the phase shift may be compensated by the phase control member 200 having an extinction coefficient Kp that has the opposite characteristic (e.g., oppositely varying) to that of the transflective metal member 193 or the reflective member 196.

Figure 8A:
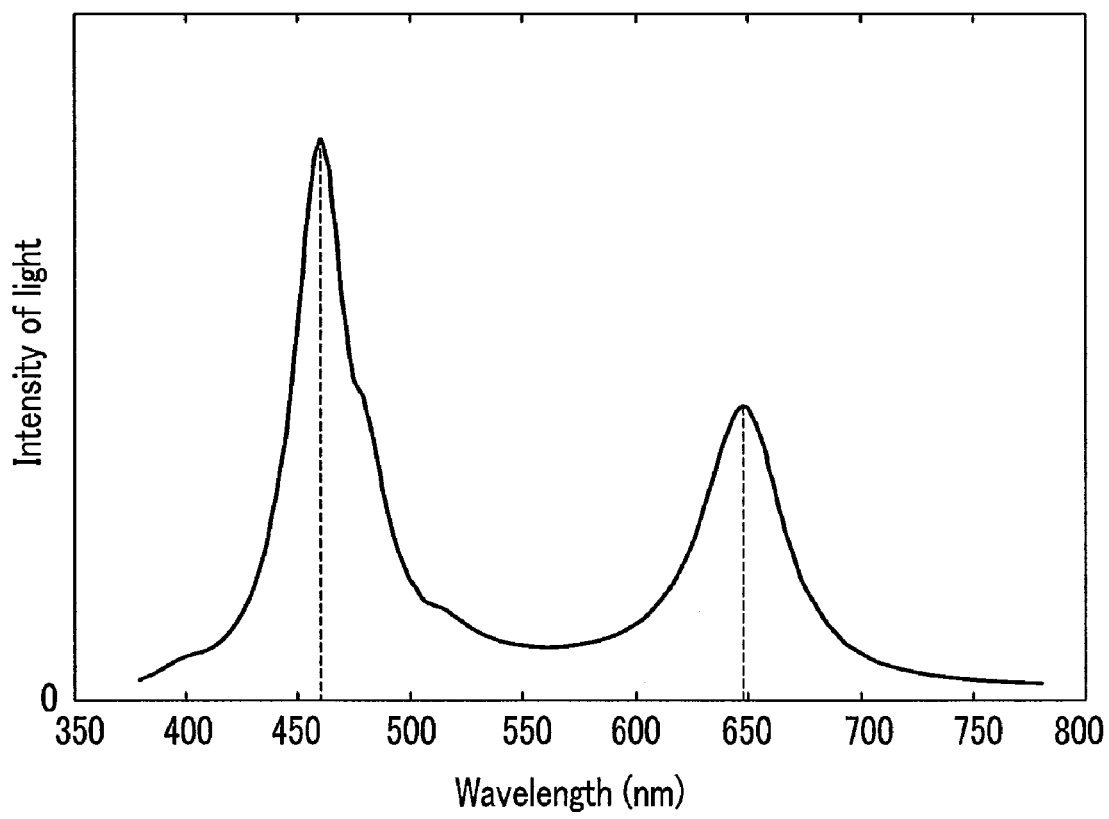
FIG. 8A is a graph showing red and blue wavelengths of light enhanced by a microcavity process when, according to an embodiment of the present invention, no phase control member is provided.
Figure 8B:
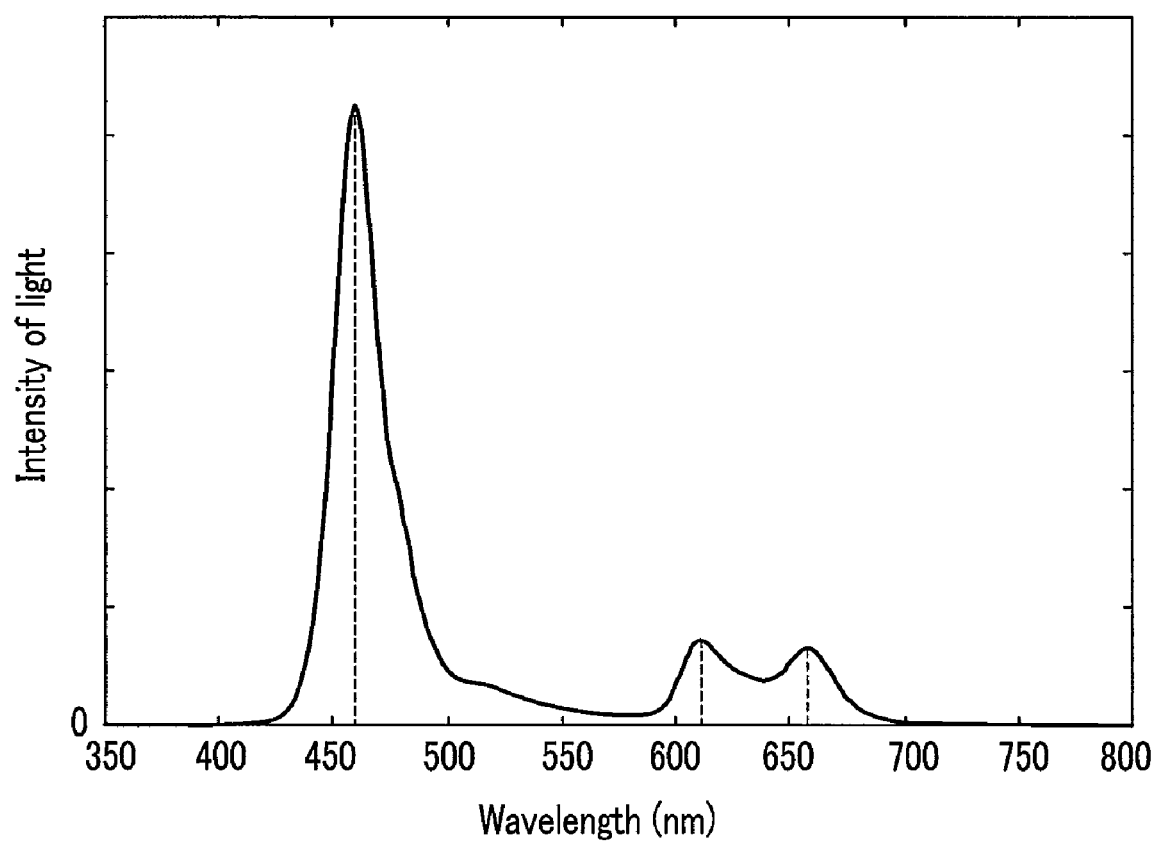
FIG. 8B is a graph showing red and blue wavelength portions of the visible light spectrum that have been emitted from an organic light emitting member and experienced a microcavity process when, according to an embodiment of the present invention, no phase control member is provided.
Figure 9A:
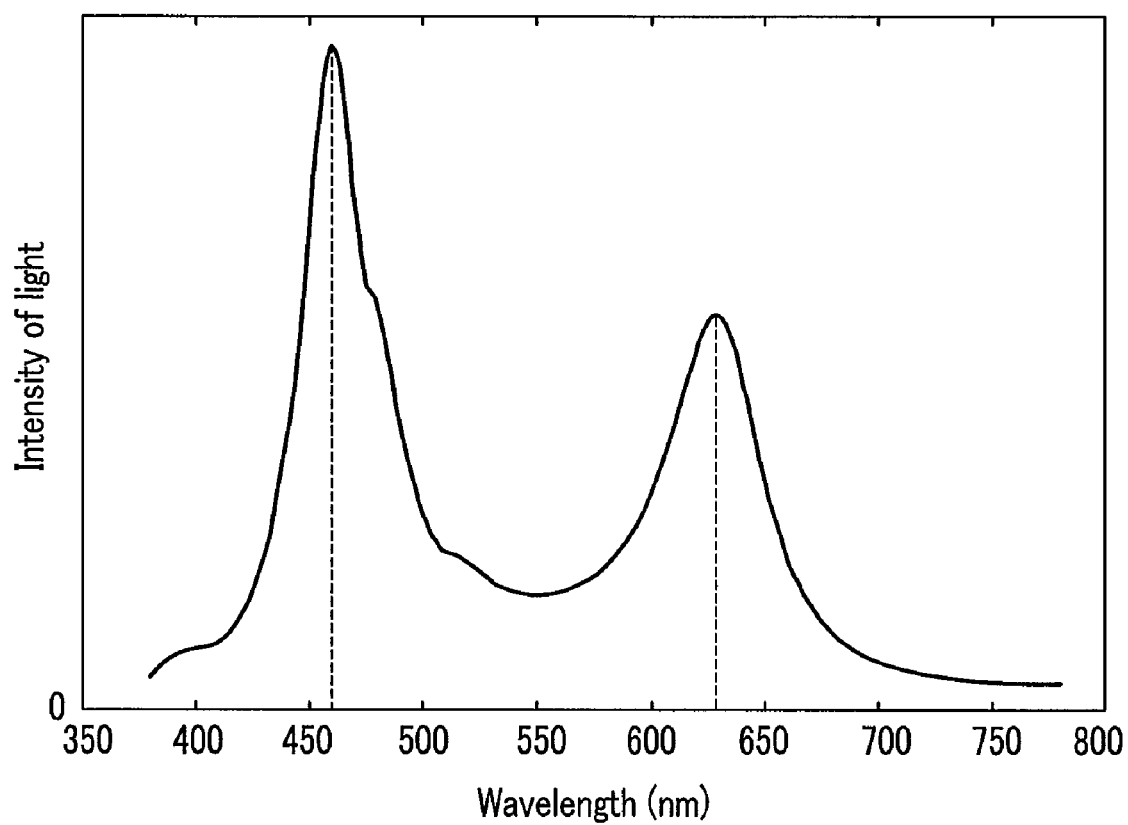
FIG. 9A is a graph showing red and blue wavelengths of light enhanced by a microcavity process when, according to an embodiment of the present invention, a phase control member is provided.
Figure 9B:
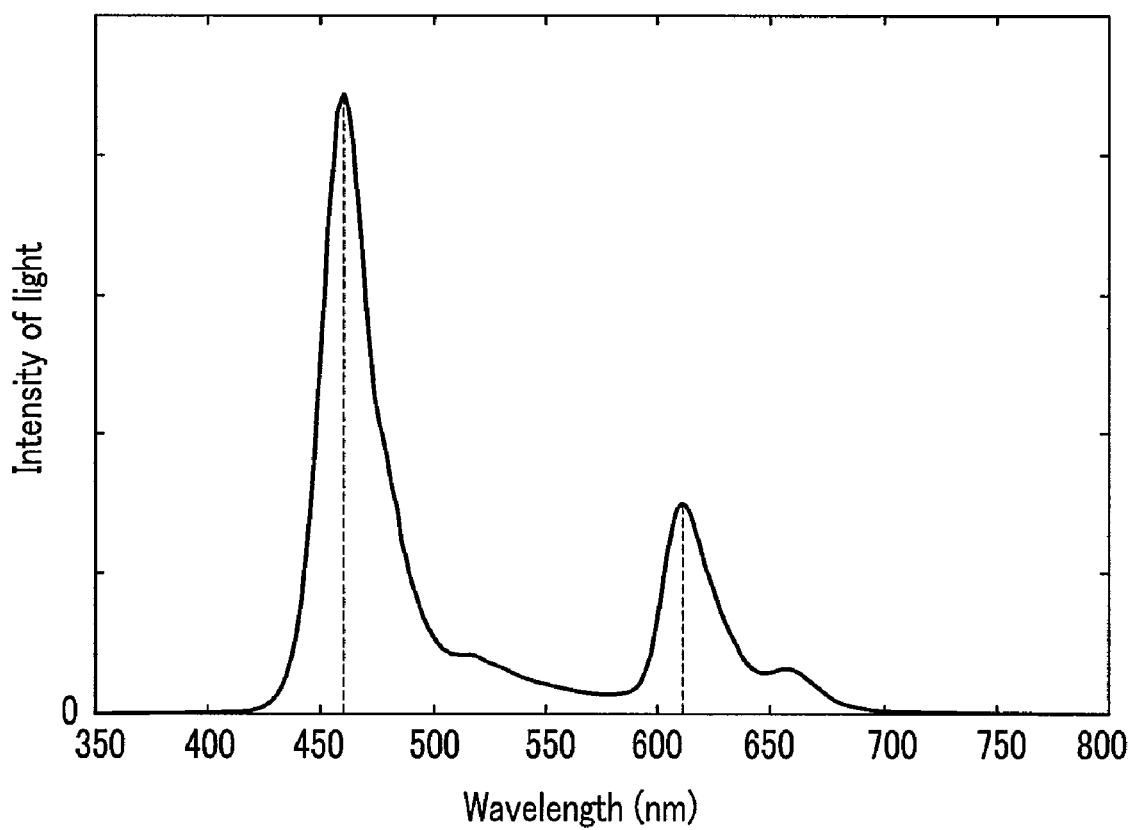
FIG. 9B is a graph showing red and blue portions of the visible light spectrum that have been emitted from an organic light emitting member and experienced a microcavity process when, according to an embodiment of the present invention, a phase control member is provided.
Figure 10:
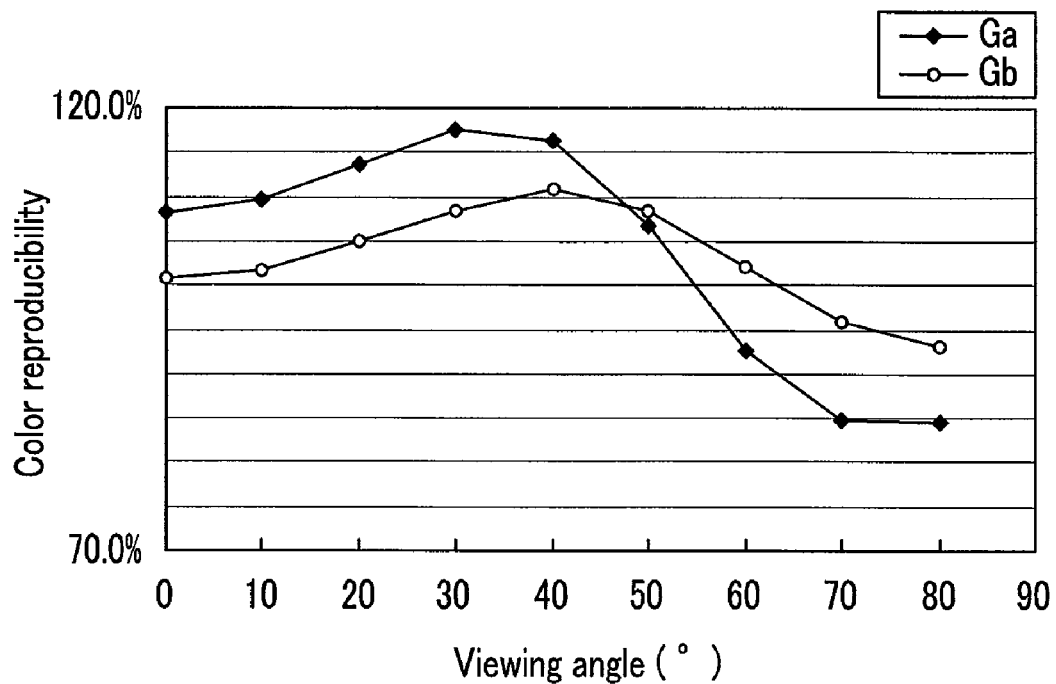
FIG. 10 is a graph showing color reproducibility according to viewing angle for an organic light emitting device according to an embodiment of the present invention.
Figure 11:
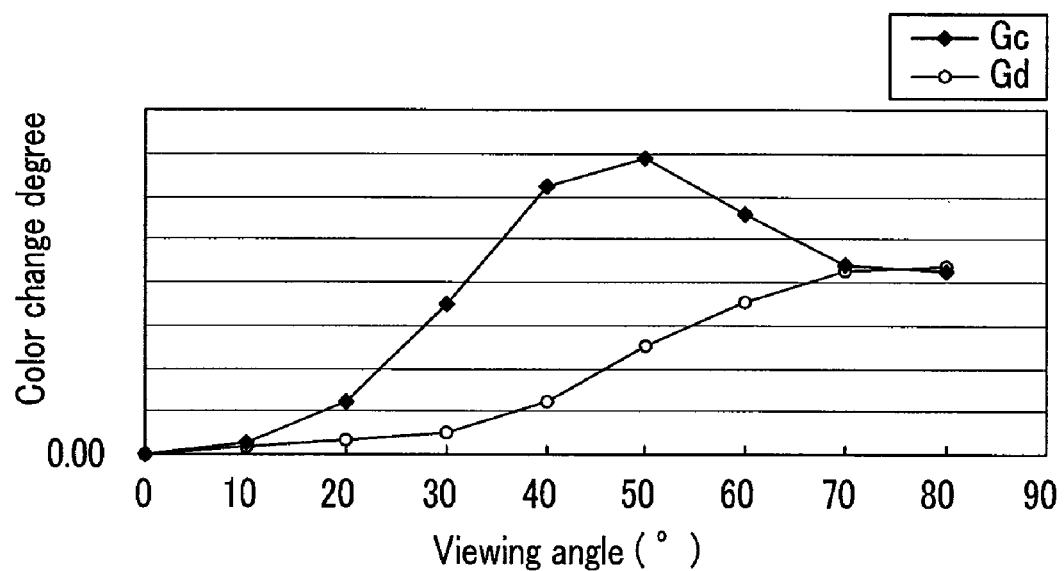
FIG. 11 is a graph showing a color change degree according to viewing angle for an organic light emitting device according to an embodiment of the present invention.

This compensation will now be described with reference to FIG. 8A through FIG. 11. FIG. 8A is a graph showing red and blue wavelengths of light enhanced by a microcavity process when, according to an embodiment, no phase control member is provided. FIG. 8B is a graph showing red and blue wavelength portions of the visible light spectrum that have been emitted from an organic light emitting member and experienced a microcavity process when, according to an embodiment, no phase control member is provided. FIG. 9A is a graph showing red and blue wavelengths of light enhanced by a microcavity process when, according to an embodiment, a phase control member is provided. FIG. 9B is a graph showing red and blue portions of the visible light spectrum that have been emitted from an organic light emitting member and experienced a microcavity process when, according to an embodiment, a phase control member is provided. FIG. 10 is a graph showing color reproducibility as a function of viewing angle of an organic light emitting device according to an embodiment, and FIG. 11 is a graph showing a color change degree as a function of viewing angle of an organic light emitting device according to an embodiment.

Referring to FIG. 8A, when, according to an embodiment, no phase control member 200 is provided, the blue wavelength enhanced by the microcavity process may be near about 460 nm, and the red wavelength may be near about 650 nm. On the other hand, the blue and red portions of the visible light spectrum that are emitted from the organic light emitting member 370 according to an embodiment have peaks near about 460 nm and 610 nm. Referring to FIG. 8B, if such light undergoes the microcavity process having the spectral characteristics as shown in FIG. 8A, the spectrum of the red wavelength ranges broadly from about 610 nm to about 660 nm. That is, a mismatch of the peaks of the red light portions of the spectrum before and after undergoing the microcavity process is generated such that the photoefficiency is deteriorated.

However, according to an embodiment, by forming a phase control member 200 of which the extinction coefficient Kp is selected to have the opposite characteristic according to the wavelength to the characteristic according to the wavelength of the extinction coefficient Km of the transflective metal member 193 and by appropriately selecting the thickness of the phase control member 200, the difference in the phase shift according to wavelength generated when incident light is reflected by the transflective metal member 193 or reflective member 196 may be compensated while passing through the phase control member 200.

In other words, comparing FIG. 9A with FIG. 8A, the blue wavelength enhanced by the microcavity process including the phase control member 200 according to an embodiment is near about 460 nm in FIG. 9A, and the peak of the red wavelength shifts to the left and is approximately about 610 nm. Thus, the peaks (near 460 nm and near 610 nm) of the blue and red portions of the visible light spectrum that are emitted from the organic light emitting member 370 almost coincide with the peaks of the red and blue portions of the visible light spectrum enhanced by the microcavity process according to an embodiment. Accordingly, the spectrum of light of the red wavelengths may have one peak near about 610 nm, as shown in FIG. 9B. Thus, if light undergoes the microcavity process including the phase control member 200 according to an embodiment, the photoefficiency and the color reproducibility may be improved.

In particular, the display characteristics according to viewing angle may be improved. Referring to FIG. 10, when the extinction coefficient Km and the thickness of the phase control member 200 are selected to compensate the difference in phase shift according to wavelength, the color reproducibility according to viewing angle may be highly maintained like the curve Gb compared with the color reproducibility Ga when no phase control member is provided. Also, referring to FIG. 11, the color shift Gd according to viewing angle may be greatly reduced compared with the case Gc in which no phase control member is provided.

In the organic light emitting device shown in FIG. 2 through FIG. 4 and FIG. 7, the phase control member 200 is disposed on the transflective metal member 193 such that the difference in the phase shift according to wavelength may be compensated while light reflected by the transflective metal member 193 passes through the phase control member 200. Alternatively, as shown in the organic light emitting device of FIG. 5, when the phase control member 200 is disposed under the transflective metal member 193, light passes through the transflective metal member 193 and reflects on the lower conductive oxide member 192, thereby passing through the phase control member 200. In another alternative, the phase control member 200 may be disposed on the upper conductive oxide member 194, or on the supplementary members 195R, 195G, and 195B.

In this way, by controlling the optical factor, such as the extinction coefficient or the thickness of the control member 200, the interval between peaks of a primary color spectrum such as red and blue may be controlled, and the peak of the spectrum of light emitted from the organic light emitting member 370 may coincide with the peak of the spectrum of light emitted by the microcavity process. Accordingly, a color reproducibility and a photoefficiency of an organic light emitting device may be increased and display characteristics according to viewing angle may be improved.

In the present embodiments, the red and blue portions of the visible light spectrum are explained as an example. Embodiments, however, are not limited thereto, and embodiments of the present invention may be applied to cases of various primary colors, of which the peaks of the spectrum are intended to coincide with each other when a microcavity process is applied. Also, even though the extinction coefficient of the transflective metal member 193 is described in the present examples, the material and the thickness of the phase control member 200 may be selected considering the characteristics of the extinction coefficient of the common electrode 270, which is another reflective member of the microcavity process. Also, the transflective metal member may be made of various different materials, not limited to a metal.

According to an embodiment of the present invention, the peak of the spectrum of light emitted from the organic light emitting member may coincide with the peak of the spectrum of light emitted by the microcavity process such that the color reproducibility and the photoefficiency of the organic light emitting device may be increased, and the display characteristics according to viewing angle may be improved. The characteristics according to various embodiments of the present invention may be applied to other organic light emitting devices having different structures.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
   a substrate;
   a transflective member disposed on the substrate;
   a phase control member disposed on or under the transflective member;
   an organic light emitting member disposed on the phase control member; and
   a common electrode disposed on the organic light emitting member, wherein an optical factor of the phase control member varies oppositely to an optical factor of the transflective member according to variation of wavelength.

2. The organic light emitting device of claim 1, wherein the wavelength comprises a wavelength of a visible light region.

3. The organic light emitting device of claim 2, wherein the optical factor of the phase control member decreases as the wavelength of the visible light region increases while the optical factor of the transflective member increases as the wavelength of the visible light region increases.

4. The organic light emitting device of claim 2, wherein the optical factor of the phase control member increases as the wavelength of the visible light region increases while the optical factor of the transflective member decreases as the wavelength of the visible light region increases.

5. The organic light emitting device of claim 1, wherein the optical factor of the phase control member comprises an extinction coefficient of the phase control member, and the optical factor of the transflective member comprises an extinction coefficient of the transflective member.

6. The organic light emitting device of claim 1, wherein the phase control member comprises at least one of a semiconductor, a dielectric material in which a semiconductor is dispersed, a transparent conductive oxide in which a semiconductor is dispersed, a dielectric material in which a nanocrystalline metal is dispersed, and a transparent conductive oxide in which a nanocrystalline metal is dispersed.

7. The organic light emitting device of claim 6, wherein the semiconductor comprises silicon (Si), germanium (Ge), or gallium arsenide (GaAs), and the transparent conductive oxide comprises indium tin oxide (ITO) or indium zinc oxide (IZO).

8. The organic light emitting device of claim 1, wherein a thickness of the phase control member is equal to or less than 500 Å.

9. The organic light emitting device of claim 1, wherein the transflective member comprises at least one of Ag and Al.

10. The organic light emitting device of claim 1, further comprising a conductive oxide member disposed on or under the transflective member.

11. The organic light emitting device of claim 10, wherein the conductive oxide member comprises ITO or IZO.

12. The organic light emitting device of claim 1, wherein the organic light emitting member emits light of white color.

13. The organic light emitting device of claim 12, further comprising a color filter disposed between the substrate and the transflective member.

14. An organic light emitting device comprising:
   a first pixel displaying a first color, a second pixel displaying a second color, and a third pixel displaying a third color, wherein each of the first, second, and third pixels comprises:
      a transflective member;
      an organic light emitting member disposed on the transflective member; and
      a common electrode formed on the organic light emitting member, and
   wherein at least one pixel of the first, second, and third pixels further comprises a phase control member disposed on or under the transflective member, and
   an optical factor of the phase control member varies oppositely to an optical factor of the transflective member according to variation of wavelength.

15. The organic light emitting device of claim 14, wherein the wavelength comprises a wavelength of a visible light region.

16. The organic light emitting device of claim 15, wherein the optical factor of the phase control member decreases as the wavelength of the visible light region increases while the optical factor of the transflective member increases as the wavelength of the visible light region increases.

17. The organic light emitting device of claim 15, wherein the optical factor of the phase control member increases as the wavelength of the visible light region increases while the optical factor of the transflective member decreases as the wavelength of the visible light region increases.

18. The organic light emitting device of claim 14, wherein the optical factor of the phase control member comprises an extinction coefficient of the phase control member, and the optical factor of the transflective member comprises an extinction coefficient of the transflective member.

19. The organic light emitting device of claim 14, wherein the phase control member comprises at least one of a semiconductor, a dielectric material in which a semiconductor is dispersed, a transparent conductive oxide in which a semiconductor is dispersed, a dielectric material in which a nanocrystalline metal is dispersed, and a transparent conductive oxide in which a nanocrystalline metal is dispersed.

20. The organic light emitting device of claim 14, wherein the thickness of the phase control member is equal to or less than 500 Å.

21. The organic light emitting device of claim 14, wherein the transflective member comprises at least one of Ag and Al.

22. The organic light emitting device of claim 14, wherein the first, second, and third pixels further comprise a conductive oxide member disposed on or under the transflective member.

23. The organic light emitting device of claim 14, wherein:
the organic light emitting member comprises a white organic light emitting member, and
the first pixel comprises a first color filter, the second pixel comprises a second color filter, and the third pixel comprises a third color filter, each of the first, second and third color filters being disposed under the transflective member.

24. The organic light emitting device of claim 14, wherein the first color comprises red, the second color comprises green, and the third color comprises blue.

25. The organic light emitting device of claim 14, wherein at least one pixel of the first, second, and third pixels further comprises a supplementary member disposed between the transflective member and the common electrode.

26. The organic light emitting device of claim 25, wherein the supplementary member comprises a transparent conductive material comprising ITO or IZO.

27. An organic light emitting device comprising:
a first pixel displaying a first color, a second pixel displaying a second color, and a third pixel displaying a third color, wherein each of the first, second, and third pixels respectively comprises:
a reflective member;
an organic light emitting member disposed on the reflective member; and
a transflective common electrode disposed on the organic light emitting member, and
wherein at least one pixel of the first, second, and third pixels further comprises a phase control member disposed on or under the reflective member, and
an optical factor of the phase control member varies oppositely to an optical factor of the transflective member according to variation of wavelength.

28. The organic light emitting device of claim 27, wherein the first pixel comprises a first color filter, the second pixel comprises a second color filter, and the third pixel comprises a third color filter, each of the first, second and third color filters being disposed under the transflective common electrode.

29. The organic light emitting device of claim 27, wherein the optical factor of the phase control member decreases as the wavelength of the visible light region increases while the optical factor of the reflective member increases as the wavelength of the visible light region increases.

30. The organic light emitting device of claim 27, wherein the optical factor of the phase control member increases as the wavelength of the visible light region increases while the optical factor of the reflective member decreases as the wavelength of the visible light region increases.

31. The organic light emitting device of claim 27, wherein the optical factor of the phase control member comprises an extinction coefficient of the phase control member, and the optical factor of the reflective member comprises an extinction coefficient of the reflective member.

* * * * *